United States Patent [19]

Ladas et al.

[11] Patent Number: 5,323,437
[45] Date of Patent: Jun. 21, 1994

[54] FULL AND PARTIAL CYCLE COUNTING APPARATUS AND METHOD

[75] Inventors: Peter N. Ladas, St. Paul; Lynn W. Moeller, Minnetonka; Frederick R. Pfeiffer, Shoreview, all of Minn.

[73] Assignee: Honeywell Inc., Minneapolis, Minn.

[21] Appl. No.: 945,560

[22] Filed: Sep. 16, 1992

[51] Int. Cl.$^5$ .............................................. G06M 3/12
[52] U.S. Cl. ..................................... 377/49; 377/23; 324/162
[58] Field of Search ..................... 377/19, 23, 28, 29, 377/49

[56] References Cited

U.S. PATENT DOCUMENTS 4,712,427 12/1987 Peters ..................................... 73/517
4,786,861 11/1988 Hulsing, II et al. .................. 324/78
5,097,490 3/1992 Hulsing, II et al. .................. 377/28

*Primary Examiner*—Timothy P. Callahan
*Assistant Examiner*—Shawn Riley
*Attorney, Agent, or Firm*—Charles J. Ungemach

[57] ABSTRACT

Apparatus for determining the number of cycles occurring in a frequency modulated signal during a sample period, including not only the number of full cycles but any portion of a cycle, by determining the number of whole cycles and adding to this a value obtained by counting the number of high frequency clock cycles occurring between the time of the last rising edge of a full cycle and the end of the sample period, and the number of high frequency clock cycles occurring from the last rising edge prior to the start of the sample period and the start of the sample period and the number of high frequency clock cycles in a whole cycle.

14 Claims, 2 Drawing Sheets

FULL AND PARTIAL CYCLE COUNTING APPARATUS AND METHOD

FIELD OF THE INVENTION

The present invention relates to a method and apparatus for accurately counting the number of cycles and partial cycles occurring in a frequency modulated electrical signal during a sample period. More particularly the invention relates to a method and apparatus for determining the incremental change in velocity experienced by the accelerometer by counting cycles in two outputs of a digital accelerometer during a sample period.

BACKGROUND OF THE INVENTION

In the art of sensing acceleration, a type of accelerometer described by a Peters U.S. Pat. No. 4,712,427 operates to produce four digital outputs. Two of these outputs are in the form of acceleration dependent frequency modulated signals. The other two outputs provide information concerning temperature and calibration coefficients respectively. To calculate the incremental change in velocity being experienced one may determine the changes in frequency between the first two outputs and provide adjustments in accordance with the second two outputs. Determining frequency changes is sometimes accomplished by means of a counter which counts the number of cycles of each output during a sample period. To obtain high accuracy, it is not only necessary to count the number of full cycles during a sample period but also any portions of a cycle which occur during that period. Having the number of full and partial cycles of the two acceleration dependent frequency modulated outputs, the average frequency during the sample period may then be numerically converted by a system processor to calculate the incremental velocity along the sensing axis of the accelerometer.

A full and partial cycle counting apparatus has been described in the Hulsing II, et al U.S. Pat. No. 4,786,861 which employs a first counter operable to provide an output count indicative of the number of full cycles in a sampling period defined by two successive strobe signals, a second counter which counts the integer number of high frequency clock cycles occurring during a full cycle of the unknown frequency and a third counter which counts the integer number of high frequency clock cycles during a time period starting with the end of the sample period and ending with the next rising edge of the signal being measured. Subtracting the ratio of the number of high frequency clock cycles during this latter time period to the number of high frequency counts during a full cycle from 1 is indicative of the portion of a full cycle that occurs before the end of the sample period. The ratio defined above indicates the portion of a full cycle that occurs after the start of the next sample period.

A problem encountered in the above described apparatus, arises from the fact that it is necessary to wait until after the end of a sample period to determine the number of high frequency clock periods existing in a portion of a cycle of the signal being measured. As a result, the information used to determine the incremental change in velocity along the sensing axis cannot be sent to the system processor for use until after the completion of the full cycle of the unknown frequency which was initiated prior to the end of the subsequent sample period.

SUMMARY OF THE INVENTION

The present invention provides an apparatus and method for determining the number of full and partial cycles occurring during a sample period of a frequency modulated digital electric signal and obtains this information during the sample period so that it may be sent to the system processor immediately after the start of the next sample period.

DETAILED DESCRIPTION OF THE INVENTION

Figure 1:
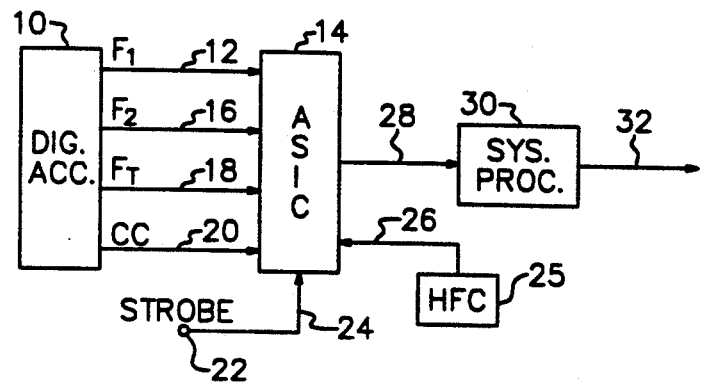
FIG. 1 shows a block diagram of the system involving the digital accelerometer, the application specific integrated circuit (ASIC) which contains the counting apparatus of the present invention and, the system processor.

In FIG. 1 a digital accelerometer 10 which may be of the type shown in the above referred U.S. Pat. No. 4,712,427 is shown producing 4 outputs, $F_1$, $F_2$, $F_T$ and CC. $F_1$ is the first frequency output indicative of acceleration, $F_2$ is the second frequency output indicative of acceleration, $F_T$ is a frequency output indicative of the temperature of the digital accelerometer, and CC is the serial data output of the digital accelerometer calibration coefficients. It will be understood that if the digital accelerometer is experiencing no acceleration, then the frequency of the outputs $F_1$ and $F_2$ will each be equal to a respective nominal value but as acceleration is experienced along the sensing axis the frequency of both $F_1$ and $F_2$ will change in magnitude. The changes in frequency of $F_1$ and $F_2$ are of opposite polarity and are approximately proportional to acceleration along the sensing axis. The temperature output $F_T$ is a frequency modulated digital output used by the system processor to adjust the system for incremental changes in temperature. The output CC is a standard serial data output used to transmit the calibration coefficients which are used to reduce the effects of bias error and gain error and the effects of nonlinearity errors, and will not be further described herein.

The output $F_1$ is shown being presented on a line 12 to an (ASIC) 14. Output $F_2$ is presented to ASIC 14 on a line 16 while output $F_T$ is presented to ASIC 14 on a line 18 and the serial data output CC is presented to ASIC 14 on a line 20.

A strobe input 22 is shown producing a signal to ASIC 14 via a line 24 and the strobe signal comprises a series of periodic pulses used to determine a sample period for finding the frequency variations of the signals $F_1$ and $F_2$. A high frequency clock 25 is also shown producing an input to ASIC 14 by a line 26. The strobe signal 22 is asynchronous with respect to high frequency clock 25.

ASIC 14 contains circuitry which will be described in connection with FIG. 3 to produce a plurality of outputs on a line 28 which are presented to a system processor 30. The signals on line 28 will be serial or parallel data signals indicative of the various outputs produced by the circuitry of FIG. 3 and the system processor 30 will operate on the signals to produce an output on a line 32 indicative of the incremental change in velocity being experienced by the digital accelerometer 10 along the sensing axis.

Figure 2:
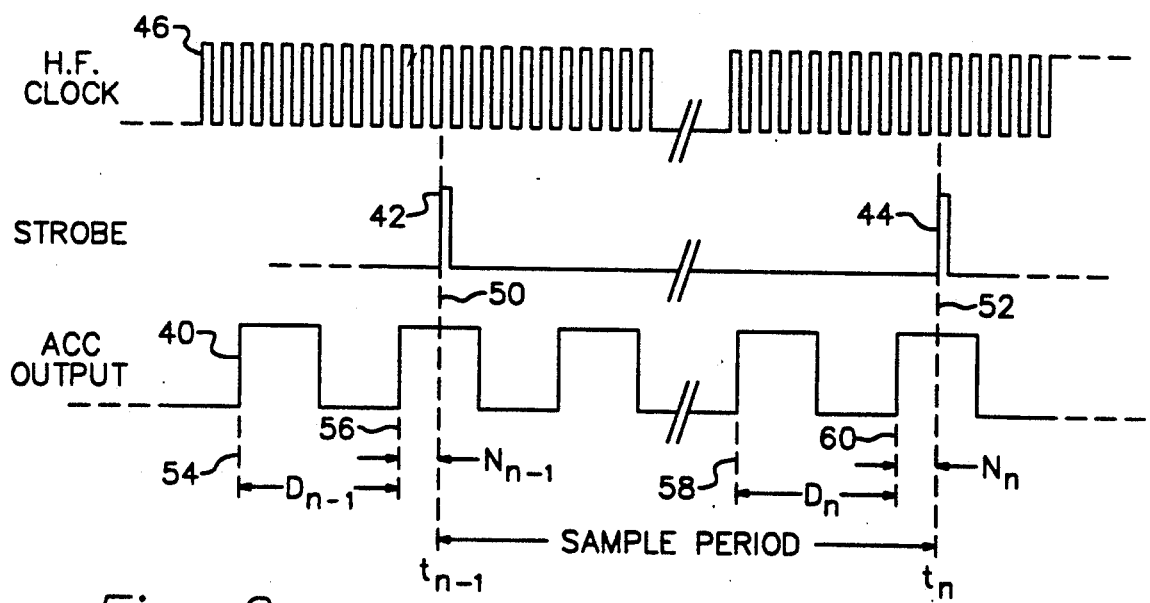
FIG. 2 is a timing diagram showing the relationship between one of the outputs of the digital accelerometer, the high frequency clock and the asynchronous strobe input defining a sample period; and, FIG. 3 is a block schematic diagram of the apparatus for accurately counting the quantity of full and partial cycles occurring during a sample period in the outputs of the digital accelerometer.

Referring to FIG. 2, one of the outputs, $F_1$ or $F_2$ of the digital accelerometer 10 (of FIG. 1) is shown as a series of cycles described by a square wave 40 at the lower portion of FIG. 2. A single sample period is shown existing between the rising edge of a first strobe pulse 42 and the rising edge of the next following strobe pulse 44 and it is during this sample period that it is desired to determine the number of full and partial cycles of the accelerometer output signal 40. Also shown in FIG. 2 is the output of a high frequency clock shown by a plurality of square wave pulses 46. A vertical dash line 50 has been drawn at the rising edge of pulse 42 to define the start of the sample period and a vertical dash line 52 has been drawn at the rising edge of pulse 44 to define the end of the sample period and these two vertical dash lines describe the sample period from time $t_{n-1}$ to $t_n$. A vertical dash line 54 is shown corresponding to the first rising edge of the last complete cycle of the accelerometer output occurring prior to the start of the sample period and a dash line 56 is shown corresponding to the rising edge of the accelerometer output 40 occurring just before the sample period. The distance between lines 54 and 56 is indicative of the time for one complete cycle and this is denoted $D_{n-1}$ in FIG. 2. A similar vertical dash line 58 is shown corresponding to the first rising edge of the last complete cycle of the accelerometer output signal 40 occurring before the end of the sample period and a similar dash line 60 is shown corresponding to the last rising edge of the accelerometer output signal 40 occurring before the end of the sample period. The distance between lines 58 and 60 is indicative of the time for one complete cycle in the accelerometer output 40 and this has been denoted $D_n$ in FIG. 2. It should be noted that $D_n$ is not necessarily equal to $D_{n-1}$ since during the sample period the acceleration can cause the compression or expansion of the length of time of a full cycle. Finally it should be noted that the distance between lines 56 and 50, which distance represents a portion of a time for a full cycle is represented in FIG. 2 by the designator $N_{n-1}$ and similarly the distance between lines 60 and line 52, which also represents a portion of a time for a full cycle, is designated $N_n$.

It will be apparent that the total number of cycles of the accelerometer output signal 40 occurring between lines 50 and 52 (the sample period) will be given by the number of full cycles occurring during this period and adding to that the portion represented by $N_n$ and the portion represented by a full cycle less $N_{n-1}$.

Figure 3:
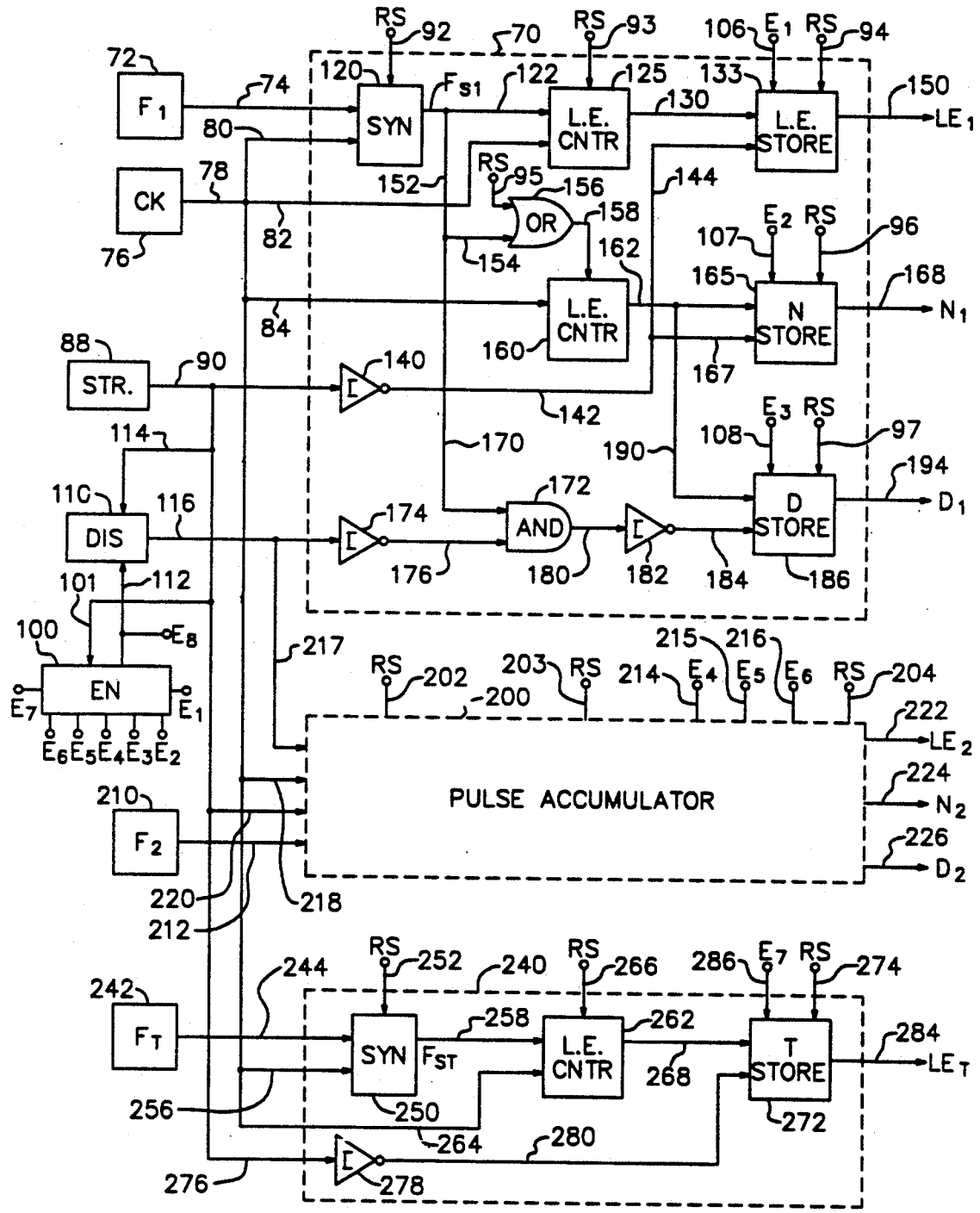

This value is obtained by a first counter in FIG. 3 which receives the accelerometer output signal 40 of FIG. 2 and continuously counts the number of leading edges, LE, that occur where each leading edge of accelerometer output signal 40 is a rising edge of signal 40. The output value of the LE counter, at the end of each sample period is sent to the system processor. The system processor uses the output value of the leading edge counter at the completion of the previous sample period ($LE_n$) and subtracts from this the output value of the leading edge counter at the start of the previous sample period ($LE_{n-1}$). This difference, less 1, is the number of full cycles in the last complete sample period. A second counter counts the number of high frequency clock pulses 46 which occur during the periods $D_{n-1}$ and $D_n$ and which occur during the periods $N_{n-1}$ and $N_n$. More specifically it will be apparent from FIG. 2 that the total number of cycles occurring during a sample period will be given by the number of rising edges less 1 plus the size of the fractional cycle which will be given by the values $N_n/D_n + (1 - N_{n-1}/D_{n-1})$. Thus the accurate count for the number of complete cycles and portions of a cycle $N_T$ will be given by the expression:

$$NT = (LE_n - LE_{n-1} - 1) + N_n/D_n + (1 - N_{n-1}/D_{n-1}) \quad (1)$$

This expression can be simplified to:

$$NT_T = LE_n - LE_{n-1} + N_n/D_n - N_{n-1}/D_{n-1} \quad (2)$$

FIG. 3 shows a circuit operable to count the various full and partial cycles present in the two frequency modulated acceleration dependent outputs of the digital accelerometer in order to arrive at the values suitable for the system processor to solve equation 2.

Turning now to FIG. 3 a pulse accumulator enclosed by dash lines 70 is shown receiving a first input from a box 72 labeled $F_1$ on a line 74. Box 72 on line 74 corresponds to the output $F_1$ identified on line 12 of FIG. 1. A second input to pulse accumulator 70 is shown being derived from a box 76, a high frequency clock generator, on a line 78 via three branches on lines 80, 82, and 84. The output from clock 76 on line 78 will be like that shown as the high frequency clock pulse signal 46 in FIG. 2. An input from a strobe box 88 is presented on a line 90 as another input to the pulse accumulator 70 and this signal will correspond to the signal represented as the strobe signal with pulses 42 and 44 in FIG. 2. A reset pulse RS originating from a source (not shown) is presented to various components in the pulse accumulator 70 at terminals labeled RS on lines 92, 93, 94, 95, 96, and 97 in FIG. 3 and these signals operate to reset the various components at the beginning of or start up of the operation and will not be further described.

An enable circuit box 100 is shown in FIG. 3 receiving an input from strobe 88 via line 90 and a line 101. The enable circuit 100 operates to produce a plurality of separate outputs $E_1$, $E_2$, $E_3$, $E_4$, $E_5$, $E_6$, $E_7$, and $E_8$ for use by various of the components in FIG. 3 as will be explained. A first of the outputs $E_1$ of enable circuit 100 is connected to a terminal 106 at the top of accumulator 70 but, for simplicity, the line showing the connection is not drawn. In similar fashion, output $E_2$ is connected to line 107 and output $E_3$ is connected to line 108 by connecting lines not shown.

A disenable box 110 is shown in FIG. 3 receiving an input $E_8$ from the enable box 100 over a line 112 and receiving an input from the strobe box 88 over line 114 to produce an output on a line 116 as an input to pulse accumulator 70 for purpose to be explained later.

Referring now to the interior of the pulse accumulator 70, a synchronizer box 120 is shown receiving the first frequency $F_1$ on line 74 and receiving a clock input from clock 76 on line 80. After being initially reset by the reset signal on line 92 the synchronizer 120, which may be of standard design, operates to provide a logic 1 output pulse as an output signal $F_{S1}$ on a line 122 with a pulse width equal to 1 high frequency clock period; the logic 1 output pulse is initiated on the first rising edge of the high frequency clock following a rising edge occurrence on $F_1$, on line 74. The synchronizer 120 operates to alter the leading edges of the signal in $F_1$ so that they occur simultaneously with the leading edge of a clock signal. Therefore, the output $F_{S1}$ on line 122 will not have leading edges of the variable frequency input occurring randomly through one of the clock cycles but rather they will occur as close as possible after the clock rising edge. The output on line 122 of the synchronizer 120 is presented to a leading edge counter shown as box 125 which also receives an input from the clock 76 over line 82 and which operates, after initially being cleared by the reset signal on line 93, to count the leading edges in the signal $F_{S1}$. It does this by utilizing, for example, 16 synchronous D-flip flops which provide a parallel output on a line 130 digitally representative of the number of rising edges of the $F_{S1}$ signal which is accumulated in the counter 125. Utilizing 16 D-flip flops gives the counter the capability of counting $2^{16}$ or 65,536 leading edges which is far more than the number of leading edges possible in the signal $F_{S1}$ during a sample period. The parallel output which is constantly changing with each rising edge of the input signal on line 122 is presented by line 130 to a leading edge store or memory box 133 which also contains 16 D-flip flops that are set in accordance with the signal on line 130. When a signal is received from the strobe 88 over lines 90 through an inverter 140 and lines 142 and 144, the logic states of the 16 D-flip flop outputs in the leading edge storage 133 are set to equal the logic state of the leading edge counter 125 16 bit parallel output over line 130 and these logic states are held until released to the system processor.

The enable circuit 100 which receives an input from the strobe 88 over lines 90 and 101 operates to produce the output $E_1$ in a timed sequence to the leading edge store box 133 over line 106 at a predetermined time after the end of a sample period as determined by the occurrence of a strobe signal from box 88. This signal $E_1$ over line 106 allows the leading edge store box 133 to release the information it has stored in the D-flip flops therein as a serial or parallel output signal $LE_1$ on line 150. This output signal on line 150 will provide the information indicative of the number of leading edges accumulated in the leading edge counter 125 after the end of the previous sample period. This information is then presented to the system processor for use in solving equation 2 above.

The synchronized output $F_{S1}$ from the synchronizer 120 is presented by a line 152 and a line 154 to one of the inputs of an or gate 156 whose other input is received via line 95 from the reset signal. A logic 1 state from either the reset input or from the synchronized signal $F_{S1}$ will produce a logic 1 output state from or gate 156 on a line 158. A signal on line 158 is presented to a second leading edge counter 160 and operates to reset the 16 D-flip flops therein if in the logic 1 state and will allow them to start counting if in the logic 0 state. The second leading edge counter 160 also receives the high frequency clock output from clock box 76 over lines 78 and 84. Accordingly the flip flops in leading edge counter 160 will produce a parallel output indicative of the number of leading edges counted in the high frequency clock signal. Since this count begins starting with each leading edge in the synchronized signal $F_{S1}$ the LE counter 160 will provide a parallel output on a line 162 indicative of the number of high frequency clock cycles that have occurred since the last leading edge of the synchronized output $F_{S1}$. This signal is presented to an "N" store box 165 which, like the leading edge store box 133, contains 16 D-flip flops which will be set by the output of the leading edge counter 160. This count is set by the signal from the strobe 88 via lines 90, inverter 140, line 142, and a line 167 at which time the count is held in the N store box 165. This signal is released in serial or parallel fashion on output line 168 upon the occurrence of a $E_2$ signal on line 107. The $E_2$ signal to N store box 165 will not occur at the same time as the $E_1$ signal on line 106 above described but rather, all of the signals $E_1-E_8$ are in timed sequence so as to allow the output 168 from the N store box 165 to be released at a different time than the output 150 from the leading edge store box 133. This occurs very rapidly, however, and the entire output from all of the various store boxes of the circuit of FIG. 3 can be presented to the system processor in far less than the time of a sample period between two strobe pulses. Accordingly it is seen that the output on line 168 is indicative of $N_1$ which is the number of high frequency clock cycles occurring from the time of the last leading edge in the synchronized signal $F_{S1}$ prior to the occurrence of the rising edge of the strobe pulse, 52 in FIG. 2. The $N_1$ output on line 168 will be used by the system processor 30 of FIG. 1 in solving the equation 2 above.

The synchronized output $F_{S1}$ from the synchronizer 120 is also presented via lines 152 and a line 170 to one of the inputs of an and gate 172 whose other input is received from the disenabler 110 via line 116, inverter 174 and a line 176. A logic 1 state exists at the output from and gate 172 on a line 180 whenever a logic 1 state exists in both the synchronized output $F_{S1}$ and the inverted disenable signal from inverter 174 on line 176. The disenabler 110 is seen to receive an input $E_8$ from the enabler 100 on a line 112 and it operates to provide an output on line 116 which will be a logic 1 state until such time as the enabler 100 provides a signal indicating that the two outputs $D_1$ and $D_2$ from the D store boxes such as 186 and the D store box within pulse accumulator 200 to be described have presented their outputs to the system processor. The purpose of this is to prevent a logic 1 state output on line 180 until after the system processor has received all of the information stored in the D store boxes for the previous sample period.

The signal on line 180 is presented to an inverter 182 to provide an output on line 184 to a D store box 186 which also receives the output from the leading edge counter 160 via lines 162 and a line 190. The D store box 186 like the leading edge store and the N store boxes above described contains 16 D-flip flops which follow the output from the leading edge counter 160 so as to store the information indicative of the number of high frequency clock cycles occurring since the last leading edge in the synchronized signal $F_{S1}$ until such time as an input on line 184 causes the D store 186 to hold or store the value of the leading edge counter 160. The output states of the D-flip flops in the D store box 186 are held in storage upon the occurrence of a logic 1 state on line 184 and like the LE store box 133 and the N store box 165 will release the $D_1$ signal stored in serial or parallel fashion on output line 194 upon the occurrence of the "$E_3$" signal on line 108. Thereafter, both the D store box 186 and the D store box within pulse accumulator 200, will not be loaded by the output from the respective LE counter during the time from the last leading edge of the strobe signal on line 114 until such time as the disenabler 110 has received an "E$_8$" signal from the enabler circuit 100 telling it that the sequence of sending the contents of the D store boxes to the system processor is completed. At that time the D store boxes will again assume the values of the outputs of the LE counters at the next leading edge occurence of the F$_{S1}$ signal. It is seen that the D store box receives information concerning a whole cycle only. At the time the E$_3$ signal on line 108 enables the contents of the D store box 186 to be released in serial or parallel fashion, the D storage box will be holding the count from the last complete cycle in the F$_{S1}$ signal prior to the occurrence of the completion of the sample period determined by the next leading edge of the strobe signal. This D$_1$ signal is released in serial or parallel fashion on a line 194 in a sequence with the previously described signals LE$_1$ and N$_1$ from lines 150 and 168.

It is thus seen that serial outputs on line 150, 168, and 194 are presented to the system processor in a way that do not overlap by virtue of the timing of the E$_1$, E$_2$ and E$_3$ signals and that these serial outputs are indicative of LE$_1$, N$_1$, and D$_1$ for use by the system processor in determining the solution to the equation 2 above. It should be noted that although no signal indicative of LE$_{n-1}$, N$_{n-1}$ or D$_n$ has been produced by the pulse accumulator 70, the information transmitted to the system processor at the start of the last sample period is, in fact, this information. The system processor therefore stores the information at the end of a sample period and then receives the information from the end of the next sample period and has all of the necessary information for use in solving equation 2 for the first signal F$_1$.

In the middle of FIG. 3 a second pulse accumulator is shown by dash lines 200. Pulse accumulator 200 is the same as pulse accumulator 70 and receives the same reset signals on lines 202, 203, and 204 as was received by the pulse accumulator 70. Pulse accumulator 200 also receives a second frequency input from box 210 via an input line 212 to provide the pulse accumulator 200 with a second frequency input signal, F$_2$, shown in FIG. 1. Box 210 on line 212 corresponds to the output F$_2$ identified on line 16 of FIG. 1. Pulse accumulator 200 also receives inputs E$_4$, E$_5$ and E$_6$ from the enable circuit 100 over a lines 214, 215 and 216 and an input from the disenable circuit 110 via lines 116 and a line 217, a clock input signal from the clock 76 via lines 78 and 218 and a strobe signal from the strobe 88 via lines 90 and 220. Accordingly the pulse accumulator 200, which contains the same circuitry as shown in connection with pulse accumulator 70, will operate in the same manner to produce three outputs on lines 222, 224, and 226 indicative of the values LE$_2$, N$_2$, and D$_2$ to the system processor 30 in a manner similar to that shown in connection with the pulse accumulator 70. The pulse accumulator 200 will also have transmitted information produced after the last sample period to the system processor and accordingly the system processor will have the LE$_{n-1}$, N$_{n-1}$ and D$_{n-1}$ values available necessary for use in solving the equation 2, above for the second signal F$_2$.

It is thus seen that the two pulse accumulators 70 and 200 of FIG. 3 provide the necessary information for the system processor 30 of FIG. 1 to solve equation 2 for both F$_1$ and F$_2$ and then to numerically determine and produce an output signal indicative of the incremental change in velocity along the sensing axis on line 32 in FIG. 1. It should also be noticed that this information can be transmitted to the system processor at a point in time just after the occurrence of a strobe pulse 44 without waiting for the accumulation of further data thereafter as was necessary in the above referred to prior art U.S. Pat. No. 4,786,681.

Finally in FIG. 3 a system for determining the number of full cycles in a frequency modulated signal indicative of the temperature of the digital accelerometer is shown comprising a third pulse accumulator shown by dash lines 240 receiving an input from the source of the frequency modulated signal indicative of temperature box 242 whose output is on a line 244. Box 242 on line 244 corresponds to the output F$_T$ identified on line 18 of FIG. 1. As was the case in connection with pulse accumulator 70 this signal is fed to a synchronizer 250 so that after a reset signal from line 252 is received, synchronizer 250 may alter the leading edge of the signal on line 244 so that it coincides with the next leading edge of a high frequency clock cycle presented from clock circuit 76 via line 78 and 256 to provide an output on a line 258 indicative of a synchronized signal F$_{ST}$. This signal is fed to a leading edge counter 262 which also receives a high frequency clock input via lines 78 and 264 so that after being reset by a reset signal on line 266, leading edge counter 262 provides an output on a line 268 indicative of the number of leading edges which occur in the signal F$_{ST}$. Since it is not necessary to be quite so accurate with respect to the temperature signal, no further action is necessary with respect to the signal F$_{ST}$ and the number of full cycles which are indicated by counting the leading edges on line 258 is sufficient information for the system to be properly adjusted in accordance with temperature. The number of leading edges from the leading edge counter 262 is presented to a temperature store box 272 and is stored in the 16 D-flip flops therein. The loading of the output states of the 16 D-flip flops within the temperature store box 272 is controlled by a signal from the strobe box 88 via lines 90 and 276, inverter 278 and a line 280 so that the accumulated count from the leading edge counter 262 is loaded and stored at the end of each sample period. This count is released in serial or parallel fashion on a line 284 upon the occurrence of an enable signal E$_7$ on line 286 to the T store box 272. Thus, in addition to the LE$_1$, N$_1$, D$_1$, LE$_2$, N$_2$, D$_2$ information received by the system processor 30 in FIG. 1, a signal LE$_T$ is presented to the system processor via line 284, to determine the incremental change in frequency of the F$_T$ signal during a sample period. To calculate this, the system processor must determine the number of full cycles N$_T$, occurring in the F$_T$ signal during a sample period. Equation 3 defines the total number of full cycles occurring during a sample period as:

$$N_T = LE_n - LE_{n-1} - 1 \tag{3}$$

By calculating N$_T$, the system processor can determine the incremental change in the digital accelerometer temperature and can provide numerical correction to the incremental change in velocity necessary because of changes in temperature which effect the two frequency modulated outputs of the digital accelerometer 10 indicative of acceleration F$_1$ and F$_2$.

It is therefore seen that I have provided a counting circuit operable to provide information indicative of the number of complete cycles and portions of a cycle existing in a signal in a way which cause the information to be transmitted to a system processor. Many variations will occur to those skilled in the art and I do not wish to be limited to the specific disclosures included herein but we shall only be limited by the following claims.

I claim:

1. Apparatus for determining the number of full cycles and any fraction of a cycle $N_t$ in an output signal $F_1$ during a sample period, the signal $F_1$ consisting of a plurality of cycles and each cycle having a leading edge comprising:

clock means producing a high frequency clock pulse; and counting means operable to count the number LE, of leading edge occurrences during the sample period, to count the number of clock cycles $N_{n-1}$, occurring between the last leading edge occurrence prior to the start of the sample period and the start of the sample period, to count the number of clock cycles $N_n$, occurring between the last leading edge occurrence prior to the end of sample period and the end of the sample period, and to count the number of clock cycles, D, occurring in the period between two consecutive leading edges, and producing an output indicative of $N_t$ in accordance with the equation $N_t = LE - N_{n-1}/D + N_n/D$.

2. Apparatus according to claim 1 wherein the counting means includes means to count a first D value, $D_{n-1}$, just prior to the start of the sample period and a second D value, $D_n$, just prior to the end of the sample period and the output indicative of $N_t$ is in accordance with the equation $N_t = LE + N_n/D_n - N_{n-1}/D_{n-1}$.

3. Apparatus according to claim 1 wherein the counting means includes means to store the number $LE_{n-1}$ of leading edge occurrences in $F_1$ at the start of the sample period and the number $LE_n$ of leading edge occurrences in $F_1$ at the end of the sample period with LE being determined by $LE_n - LE_{n-1}$.

4. Apparatus according to claim 1 further including means to generate a first pulse to mark the start of the sample period and a second pulse to mark the end of the sample period.

5. Apparatus according to claim 1 wherein the signal $F_1$ is an output of a digital accelerometer having a sensing axis and $N_t$ is indicative of the incremental change in velocity along the sensing axis.

6. Apparatus according to claim 5 wherein the digital accelerometer has a second output $F_2$ and further including apparatus for determining the number of full cycles and any fraction of a cycle $N'_t$ in $F_2$ during the sample period, the signal $F_2$ consisting of a plurality of cycles with each cycle having a leading edge and the counting means is operable to count the number LE', of leading edge occurrences during the sample period, to count the number of clock cycles $N'_{n-1}$, occurring between the last leading edge occurrence prior to the start of the sample period and the start of the sample period, to count the number of clock cycles $N'_n$, occurring between the last leading edge occurrence prior to the end of sample period and the end of the sample period, counting the number of clock cycles D', between two consecutive leading edges and producing an output indicative of $N'_t$ in accordance with the equation $N'_t = LE' + N'_n/D' - N'_{n-1}/D'$.

7. Apparatus according to claim 6 wherein the counting means includes means to count a first D' value $D'_{n-1}$, just prior to the start of the sample period and a second D' value $D'_n$, just prior to the end of the sample period and the output indicative of $N'_t$ is in accordance with the equation $$N'_t = LE' + N'_n/D'_n - N'_{n-1}/D'_{n-1}.$$

8. Apparatus according to claim 6 wherein the counting means includes means to store the number $LE'_{n-1}$ of leading edge occurrences in $F_2$ at the start of the sample period and the number $LE'_n$ of leading edge occurrences in $F_2$ at the end of the sample period with LE' being determined by $LE'_n - LE'_{n-1}$.

9. Apparatus according to claim 6 further including processor means connected to receive the outputs indicative of $N_t$ and $N'_t$ and operable to produce a resultant output indicative of the incremental change in velocity along the sensing axis.

10. Apparatus according to claim 9, further including circuit means receiving an output signal $F_T$ which varies in frequency with temperature and operable to produce a signal $LE_T$ to the processor so as to modify the calculation of incremental velocity along the sensing axis as a function of temperature.

11. Apparatus according to claim 10 wherein the signal $F_T$ is a plurality of cycles and the circuit means includes counting means to count the number of cycles in $F_T$ during the sample period to produce $LE_T$.

12. The method of determining the number of cycles and portions of a cycle $N_t$ in a signal $F_1$ during a sample period with each cycle having a leading edge comprising the steps of:

A) producing first and second strobe pulses to define a sample period;

B) producing a plurality of clock cycles during the sample period;

C) counting the number of leading edge occurrences LE in $F_1$ during the sample period;

D) counting the number of clock cycles $N_{n-1}$ between the last leading edge in $F_1$ prior to the start of the sample period and the first strobe pulse;

E) counting the number of clock cycles $N_n$ between the last leading edge in $F_1$ prior to the end of the sample period and the second strobe pulse;

F) counting the number of clock cycles D during two consecutive leading edges in $F_1$; and G) solving for $N_t$ according to the equation $$N_t = LE + N_n/D - N_{n-1}/D.$$

13. The method of claim 12 wherein step F) includes the further steps of:

F1) counting the number of clock cycles $D_{n-1}$ occurring between the last two leading edges in $F_1$ prior to the start of the sample period;

F2) counting the number of clock cycles $D_n$ occurring between the last two leading edges in $F_1$ prior to the end of the sample period, and wherein step G) solves for $N_t$ for $F_1$ according to the equation $$N_t = LE + N_n/D_n - N_{n-1}/D_{n-1}.$$

14. The method of claim 12, wherein step C includes the further step of:

C1) storing the number $LE_{n-1}$ of leading edge occurrences in $F_1$ at the start of the sample period, C2) storing the number $LE_n$ of leading edge occurrences in $F_1$ at the end of the sample period and C3) producing LE in accordance with the equation $$LE = LE_n - LE_{n-1}.$$

* * * * *